United States Patent
Bonne et al.

(10) Patent No.: US 12,089,307 B2
(45) Date of Patent: Sep. 10, 2024

(54) DYNAMICALLY REGULATED MICRO-LED PIXEL ARRAY

(71) Applicant: Lumileds LLC, San Jose, CA (US)

(72) Inventors: Ronald Johannes Bonne, Plainfield, IL (US); Zhi Hua Song, Palo Alto, CA (US)

(73) Assignee: Lumileds LLC, San Jose, CA (US)

( * ) Notice: Subject to any disclaimer, the term of this patent is extended or adjusted under 35 U.S.C. 154(b) by 226 days.

(21) Appl. No.: 17/824,805

(22) Filed: May 25, 2022

(65) Prior Publication Data

US 2023/0021907 A1  Jan. 26, 2023

Related U.S. Application Data

(63) Continuation of application No. PCT/US2020/062452, filed on Nov. 26, 2020.
(Continued)

(51) Int. Cl.
*H05B 45/3725* (2020.01)
*G09G 3/32* (2016.01)
(Continued)

(52) U.S. Cl.
CPC .......... *H05B 45/3725* (2020.01); *G09G 3/32* (2013.01); *H01L 27/156* (2013.01); *H05B 45/18* (2020.01);
(Continued)

(58) Field of Classification Search
CPC .. H05B 45/3725; H05B 45/18; H05B 45/325; H05B 45/44; H05B 47/165; H05B 45/37; H05B 33/02; G09G 3/32; G09G 2330/028; G09G 2330/12; G09G 2380/10; H01L 27/156
See application file for complete search history.

(56) References Cited

U.S. PATENT DOCUMENTS

| | | | |
|---|---|---|---|
| 2010/0141159 A1* | 6/2010 | Shiu ...................... | H05B 45/18 315/309 |
| 2013/0076250 A1* | 3/2013 | Logiudice .............. | H05B 45/37 315/161 |

(Continued)

FOREIGN PATENT DOCUMENTS

| | | |
|---|---|---|
| CN | 103175624 | 6/2013 |
| CN | 115004860 | 9/2022 |

(Continued)

OTHER PUBLICATIONS

English translation of KR20110139499A (Year: 2011).*
(Continued)

*Primary Examiner* — Daniel D Chang
(74) *Attorney, Agent, or Firm* — Schwegman, Lundberg & Woessner, P.A.

(57) ABSTRACT

A lighting system includes an LED array having a plurality of LED pixels and a power controller. The power controller adjusts a supply voltage for powering the LED pixels based on one or more conditions of the LED array. The power controller may determine the supply voltage based on process data of the LED array. The power controller may adjust the supply voltage based on an operating temperature of the LED pixels and the amplitude of a current driving the LED pixels.

13 Claims, 5 Drawing Sheets

Related U.S. Application Data

(60) Provisional application No. 62/941,123, filed on Nov. 27, 2019.

(51) Int. Cl.
  *H01L 27/15* (2006.01)
  *H05B 45/18* (2020.01)
  *H05B 45/325* (2020.01)
  *H05B 45/44* (2020.01)
  *H05B 47/165* (2020.01)

(52) U.S. Cl.
  CPC ........... *H05B 45/325* (2020.01); *H05B 45/44* (2020.01); *H05B 47/165* (2020.01); *G09G 2330/028* (2013.01); *G09G 2330/12* (2013.01); *G09G 2380/10* (2013.01)

(56) References Cited

U.S. PATENT DOCUMENTS

| | | |
|---|---|---|
| 2015/0257232 A1 | 9/2015 | Kimura |
| 2019/0200427 A1 | 6/2019 | Albou et al. |
| 2023/0007747 A1 | 1/2023 | Bonne et al. |

FOREIGN PATENT DOCUMENTS

| | | |
|---|---|---|
| EP | 1505565 A1 | 2/2005 |
| EP | 3592113 A1 | 1/2020 |
| KR | 20110139499 A | 12/2011 |
| WO | 2010113316 | 10/2010 |
| WO | WO-2021108735 A1 | 6/2021 |

OTHER PUBLICATIONS

"Application Serial No. PCT/US2020/062452, International Search Report mailed Mar. 4, 2021", 4 pgs.

"Application Serial No. PCT/US2020/062452, Written Opinion mailed Mar. 4, 2021", 8 pgs.

"International Application Serial No. PCT US2020 062452, International Preliminary Report on Patentability mailed Jun. 9, 2022", 9 pgs.

"U.S. Appl. No. 17/779,949, Non Final Office Action mailed Apr. 27, 2023", 7 pgs.

"Japanese Application Serial No. 2022-530977, Notification of Reasons for Refusal mailed Jun. 29, 2023", with English translation, 16 pages.

"U.S. Appl. No. 17/779,949, Response filed Aug. 21, 2023 to Non Final Office Action mailed Apr. 27, 2023", 8 pgs.

"U.S. Appl. No. 17/779,949, Examiner Interview Summary mailed Aug. 24, 2023", 2 pgs.

"U.S. Appl. No. 17/779,949, Notice of Allowance mailed Aug. 30, 2023", 7 pgs.

"U.S. Appl. No. 17/779,949, Corrected Notice of Allowability mailed Sep. 13, 2023", 2 pgs.

"Japanese Application Serial No. 2022-530977, Response filed Dec. 1, 2023 to Notification of Reasons for Refusal mailed Jun. 29, 2023", with machine English translation, 19 pages.

"Korean Application Serial No. 10-2022-7021302, Notice of Preliminary Rejection mailed Apr. 9, 2024", W/English Translation, 16 pgs.

"Korean Application Serial No. 10-2022-7021302, Response filed Jun. 4, 2024 to Notice of Preliminary Rejection mailed Apr. 9, 2024", W/English Claims, 16 pgs.

* cited by examiner

DYNAMICALLY REGULATED MICRO-LED PIXEL ARRAY

CROSS REFERENCE TO RELATED APPLICATION

This application is a continuation of International Application No. PCT/US2020/062452, filed on Nov. 26, 2020, which application claims the benefit of and priority to U.S. Provisional Application No. 62/941,123, filed Nov. 27, 2019, the disclosures of which are hereby incorporated by reference herein in their entireties for all purposes.

TECHNICAL FIELD

The present disclosure relates generally to the use and control of a dynamic power supply in micro-LED pixel arrays.

BACKGROUND

Micro light emitting diode (micro-LED) arrays are currently being developed for use in lighting and display applications. Micro-LED control systems can support arrays of thousands to millions of microscopic LED pixels that actively emit light and are individually controlled. As compared to backlight LED technologies, micro-LED arrays can have higher brightness and energy efficiency, making them attractive for a variety of applications such as televisions, automotive headlights, mobile phones, residential lighting, commercial lighting, or architectural lighting. To display an image, the current levels of the micro-LED pixels at different locations on an array can be adjusted individually according to a specific image, light intensity, or color profile.

A micro-LED lighting system can include an LED array matrix having n LED pixels, each of which has one or more LEDs connected in series or parallel. To display an image, current levels of individual micro-LED pixels at different locations on the array matrix are adjusted. An LED control system may use pulse width modulation (PWM) control for dimming and color tuning functionality. PWM control works by turning on and off the pixels at a certain frequency, in effect adjusting the ratio between the conduction time and the period or cycle time, also known as a duty cycle. The average DC current through a pixel is the product of the current amplitude and the duty cycle.

In a conventional PWM-based imaging technology, a system control unit determines the duty cycle value of each pixel based on a received image. The current amplitude can be kept identical for all pixels for a given image, but the current amplitude may vary between different images. Therefore, the individual duty cycle sets the pattern of the image, and the current amplitude is either a constant or a collective variable to adjust the brightness of the whole array, providing global dimming.

DESCRIPTION OF EXAMPLE EMBODIMENTS OF THE DISCLOSURE

Overview

Figure 1:
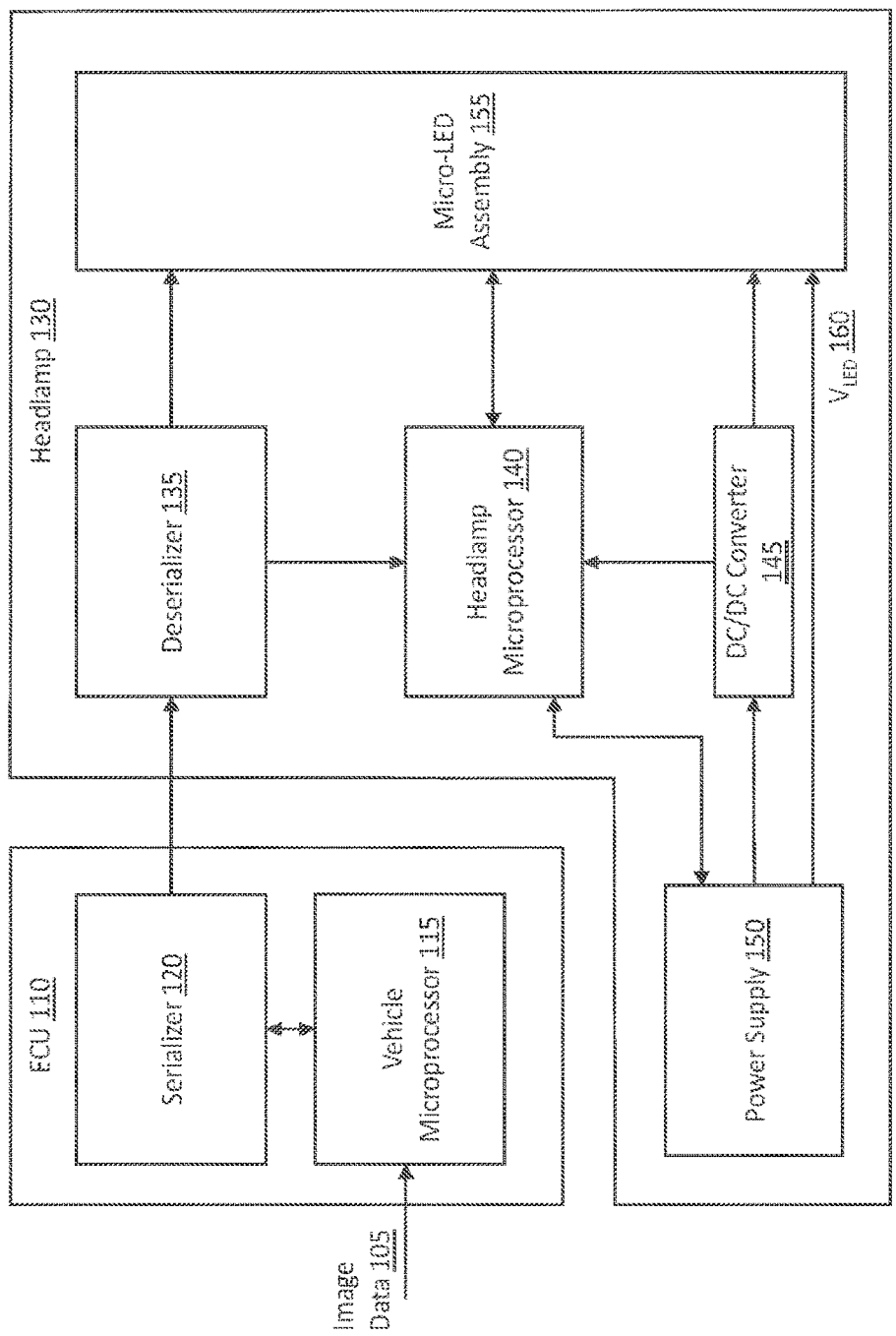
FIG. 1 is a block diagram of an example vehicle headlamp system that includes a micro-LED assembly according to some embodiments of the present disclosure.

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

For purposes of illustrating the LED pixel assemblies described herein, it might be useful to understand phenomena that may come into play in micro-LED assemblies with PWM control. The following foundational information may be viewed as a basis from which the present disclosure may be properly explained. Such information is offered for purposes of explanation only and, accordingly, should not be construed in any way to limit the scope of the present disclosure and its potential applications.

Existing micro-LED arrays that use PWM control typically include, in each pixel, a micro-LED, a PWM switch, and a transistor that acts as a current source for the micro-LED. The transistor receives a current signal at its gate; the current signal is used to set a current amplitude for the micro-LED. The micro-LED receives a fixed supply voltage for powering the micro-LED. In a typical PWM-controlled micro-LED array, all of the micro-LEDs receive the same current control signal, and all of the micro-LEDs receive the same supply voltage. The supply voltage is generally fixed.

However, in operation, the minimum required supply voltage for a micro-LED array is not a constant. Instead, it is a function of the process spread of the micro-LED array, e.g., process spread of LED forward voltage and of current source voltage caused by variation in production. Further, the LED forward voltage varies based on temperature. In addition, if different current source amplitudes are used, the LED forward voltage and current source voltage also vary based on the selected current source amplitude. In order to cover all the variations between LED arrays and operating conditions, in prior micro-LED arrays, the power supply voltage was set at the maximum value for worst case conditions to guarantee operation. However, use of an excessively high power supply voltage that is greater than what is actually required for a specific operating condition requires the extra voltage to be absorbed by the current source switch in the form of losses. These losses reduce the system power efficiency and can also lead to overheating or other thermal issues.

Embodiments of the present disclosure provide a variable power supply and dynamic control of the power supply. A power supply control block retrieves condition data describing forward voltage properties of the LED array and operating conditions of the LED array, e.g., temperature and current amplitude. The LED array may be tested during production to obtain process spread data describing LED forward voltage and/or current source voltage, such as a minimum supply voltage under a set of baseline testing condition. Process spread data may further include data describing how the minimum supply voltage varies based on current and/or temperature. The power supply control block receives real-time operating condition data and determines a supply voltage specific to the LED array based on the operating conditions. The power supply control block dynamically adjusts the supply voltage provided by the power supply to the LED array as operating conditions vary over time. This increases efficiency of the LED array and avoids thermal issues in the LED array brought on by excessive power losses.

In one aspect, a lighting system includes an LED array and a control block. The LED array includes a plurality of LED pixels, each LED pixel arranged to receive a power supply voltage from a power supply that generates a dynamically adjustable power supply voltage. The LED array further includes at least one current source to drive the plurality of LEDs. The control block is configured to be coupled to the power supply and adjusts the power supply voltage generated by the power supply based on at least one condition of the LED array.

In another aspect, a method for setting a power supply voltage for an LED array includes receiving operating condition data describing operating conditions of an LED array comprising a plurality of LED pixels; retrieving process data associated with the LED array, the process data describing forward voltage for the plurality of LED pixels under at least one operating condition; and determining a power supply voltage to power the LED array based on the operating condition data and the process data.

In still another aspect, an LED array includes a plurality of LED pixels arranged in a matrix and at least one temperature sensor to sense a temperature of the LED array. Each LED pixel includes at least one LED coupled to a supply voltage, a current source to drive the at least one LED at an operating current having a current amplitude, and a PWM switch for alternately driving the at least one LED with the operating current. The at least one temperature sensor is located proximate to at least one of the plurality of LED pixels.

As will be appreciated by one skilled in the art, aspects of the present disclosure, in particular aspects of micro-LED pixel arrays with a dynamically regulated power supply, described herein, may be embodied in various manners—e.g. as a method, a system, a computer program product, or a computer readable storage medium. Accordingly, aspects of the present disclosure may take the form of an entirely hardware embodiment, an entirely software embodiment (including firmware, resident software, micro-code, circuit designs, etc.) or an embodiment combining software and hardware aspects that may all generally be referred to herein as a "circuit," "module" or "system." Functions described in this disclosure may be implemented as an algorithm executed by one or more hardware processing units, e.g. one or more microprocessors, of one or more computers. In various embodiments, different steps and portions of the steps of each of the methods described herein may be performed by different processing units. Furthermore, aspects of the present disclosure may take the form of a computer program product embodied in one or more computer readable medium(s), preferably non-transitory, having computer readable program code embodied, e.g., stored, thereon. In various embodiments, such a computer program may, for example, be downloaded (updated) to the existing devices and systems or be stored upon manufacturing of these devices and systems.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. The terms "substantially," "close," "approximately," "near," and "about," generally refer to being within +/−20%, preferably within +/−10%, of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms such as "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, showing, by way of illustration, some of the embodiments that may be practiced. In the drawings, same reference numerals refer to the same or analogous elements/materials so that, unless stated otherwise, explanations of an element/material with a given reference numeral provided in context of one of the drawings are applicable to other drawings where elements/materials with the same reference numerals may be illustrated. For convenience, if a collection of drawings designated with different letters are present, e.g., FIGS. 2A-2C, such a collection may be referred to herein without the letters, e.g., as "FIG. 2." The accompanying drawings are not necessarily drawn to scale. Moreover, it will be understood that certain embodiments can include more elements than illustrated in a drawing, certain embodiments can include a subset of the elements illustrated in a drawing, and certain embodiments can incorporate any suitable combination of features from two or more drawings.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

In some examples provided herein, interaction may be described in terms of two, three, four, or more electrical components. However, this has been done for purposes of clarity and example only. It should be appreciated that the devices and systems described herein can be consolidated in any suitable manner. Along similar design alternatives, any of the illustrated components, modules, and elements of the accompanying drawings may be combined in various possible configurations, all of which are clearly within the broad scope of the present disclosure. In certain cases, it may be easier to describe one or more of the functionalities of a given set of flows by only referencing a limited number of electrical elements.

The following detailed description presents various descriptions of specific certain embodiments. However, is to be understood that other embodiments may be utilized, and structural or logical changes may be made without departing from the scope of the present disclosure. In general, the innovations described herein can be embodied in a multitude of different ways, for example, as defined and covered by the claims and/or select examples, and the following detailed description is not to be taken in a limiting sense.

Example Systems for Micro-LED Arrays

Micro-LED arrays support applications that benefit from fine-grained intensity, spatial, and temporal control of light distribution. For example, micro-LED arrays can provide precise spatial patterning of emitted light from pixel blocks or individual pixels. Depending on the application, emitted light may be spectrally distinct, adaptive overtime, and/or environmentally responsive. Micro-LED arrays may provide pre-programmed light distribution in various intensity, spatial, or temporal patterns. The emitted light may be based at least in part on received sensor data. Associated optics may be distinct at a pixel, pixel block, or device level. Example micro-LED arrays include devices having a commonly controlled central block of high intensity pixels with an associated common optic, and edge pixels that have individual optics. Some applications supported by micro-LED arrays include video lighting, automotive headlights, architectural and area illumination, street lighting, and informational displays.

Vehicle headlamps, or headlights, are one example application of micro-LED arrays. Vehicle headlamps comprised of micro-LED include a large number of pixels and have a high data refresh rate. Automotive headlights that actively illuminate only selected sections of a roadway can be used to reduce problems associated with glare or dazzling of oncoming drivers. For example, using infrared cameras as sensors, micro-LED arrays can activate only those pixels needed to illuminate the roadway, while deactivating pixels that may dazzle pedestrians or drivers of oncoming vehicles. As another example, a micro-LED array may be used to selectively illuminate off-road pedestrians, animals, or signs to improve driver environmental awareness. If pixels of the micro-LED array are spectrally distinct, the color temperature of the light may be adjusted according to respective daylight, twilight, or night conditions. Some pixels may be used for optical wireless vehicle to vehicle communication.

FIG. 1 is a block diagram of an example vehicle headlamp system 100 that includes a micro-LED assembly. The vehicle headlamp system 100 includes an electronic control unit (ECU) 110 and a headlamp 130. While one headlamp 130 is shown in FIG. 1, it should be understood that the vehicle includes two or more headlamps similar to headlamp 130, the other headlamps are similar to the headlamp 130 and operate in a similar manner. Furthermore, other vehicle lights (e.g., running lights, fog lights, etc.) may be similarly configured and operate in a similar manner to the headlamp 130 depicted in FIG. 1.

The ECU 110 is an embedded system within a vehicle that controls electrical systems or subsystems of the vehicle, including the headlamp 130. In addition to controlling headlamps, the ECU 110 may include, for example, controls for engine components, powertrain components, doors, brakes, telematics, battery management, etc. The ECU 110 may be located in or near the engine compartment. The ECU 110 receives image data 105, e.g., from a memory accessible to the ECU 110 that stores different headlamp images used in different settings or applications. A vehicle microprocessor 115 of the ECU 110 may generate or select an image for the headlamp 130. For example, the vehicle microprocessor 115 receives data from one or more environmental sensors, selects an image for the headlamp 130 based on the sensed environment, and retrieves image data 105 for the selected image. The vehicle microprocessor 115 generates control signals for the headlamp 130 based on the selected image and transmits the control signals to the serializer 120. The serializer 120 serializes the control signals and transmits them over a serial connection, such as an unshielded twisted pair (UTP) or coaxial connection. The serializer 120 may convert the control signals to a low voltage differential signaling (LVDS) format. The physical connection and data format between the ECU 110 and headlamp 130 are selected so that the control signals are reliably transmitted through the vehicle, which may experience a wide temperature variation, moisture, noise, and other adverse conditions.

Figures 4, 5:
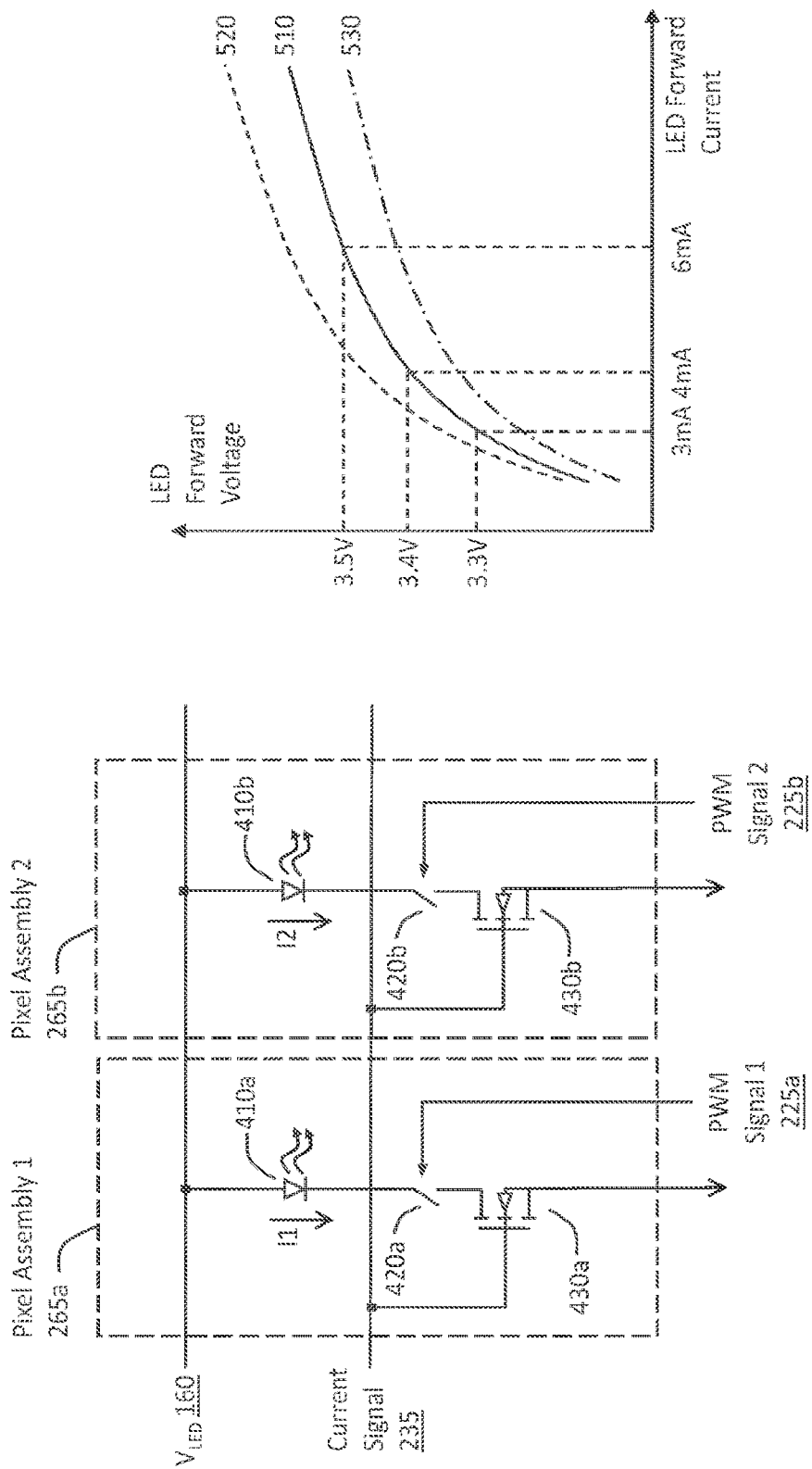
FIG. 4 is a block diagram illustrating two exemplary pixel assemblies according to some embodiments of the present disclosure.
FIG. 5 is a graph illustrating an example relationship between forward current and forward voltage.

The headlamp 130 includes a deserializer 135 that reformats the control signals and transmits the control signals to a micro-LED assembly 155. For example, the control signals provided to the micro-LED assembly 155 may include a vertical synch signal, a pixel clock, a pixel enable signal, and a number of pixel data lines. The micro-LED assembly 155 outputs an image according to the control signal. The micro-LED assembly 155 is shown in further detail in FIGS. 2 and 3, and an example pixel assembly is shown in FIG. 4.

The headlamp 130 also includes a headlamp microprocessor 140, a DC/DC converter 145, and a power supply 150. The deserializer 135 provides control signals to the headlamp microprocessor 140, and may receive feedback (e.g., error information) from the headlamp microprocessor 140 to return to the ECU 110. In this arrangement, the headlamp microprocessor 140 controls the power supply 150, which supplies power to the DC/DC converter 145 via one output line and to the micro-LED assembly 155 via a second output line. The voltage supplied by the power supply 150 to the micro-LED assembly 155, referred to as V w 160, is used to power the LED pixels. The voltage sent to the DC/DC converter is used to power internal logic of the headlamp 130, e.g., the headlamp microprocessor 140 and logic internal to the micro LED assembly 155. The DC/DC converter 145 converts the direct current (DC) signal received from the power supply to a different voltage used to power the headlamp microprocessor 140 and the micro-LED assembly 155 logic. The DC/DC converter 145 distributes the converted DC voltage to the headlamp microprocessor 140 and the micro-LED assembly 155. The headlamp microprocessor 140 also has an interface to the micro-LED assembly 155, e.g., to exchange data, provide clock control, and receive fail data from the micro-LED assembly 155 in the event of a failure.

It should be understood that the vehicle headlamp system 100 is only one example application of a micro-LED array. In another application, a micro-LED assembly 155 is used in a lighting installation to selectively and adaptively illuminate buildings or environments for improved visual display or to reduce lighting costs. For example, in conjunction with tracking sensors and/or cameras, micro-LED arrays may be used to selectively illuminate areas around pedestrians. As another example application, micro-LED arrays are used to project media facades for decorative motion or video effects. Spectrally distinct pixels may be used to adjust the color temperature of lighting, as well as support wavelength specific horticultural illumination.

Street lighting is another example application that benefits from use of micro-LED arrays. A single type of light emitting array may be used to mimic various street light types, allowing, for example, switching between a Type I linear street light and a Type IV semicircular street light by appropriate activation or deactivation of selected pixels. Street lighting costs may be lowered by adjusting light beam intensity or distribution according to environmental conditions or time of use. For example, light intensity and area of distribution may be reduced when pedestrians are not present. If pixels of the micro-LED array are spectrally distinct, the color temperature of the light may be adjusted according to respective daylight, twilight, or night conditions.

Micro-LED arrays are also well suited for supporting applications requiring direct or projected displays. For example, warning, emergency, or informational signs may all be displayed or projected using micro-LED arrays. This allows, for example, color changing or flashing exit signs to be projected. If a micro-LED array is composed of a large number of pixels, textual or numerical information may be presented. Directional arrows or similar indicators may also be provided.

A micro-LED array may be used alone or in conjunction with primary or secondary optics, including lenses or reflectors. To reduce overall data management requirements, some or all of the pixels in the micro-LED array can be limited to on/off functionality or switching between relatively few light intensity levels. Full pixel level control of light intensity is not necessarily supported.

In operation, image data corresponding to pixels in the micro-LED array is used to define response of corresponding pixels in the micro-LED array, with intensity and spatial modulation of the pixels being based on the image(s). To reduce data rate issues, groups of pixels (e.g. 5×5 blocks) can be controlled as single blocks in some embodiments. High speed and high data rate operation may be supported, with pixel values from successive images able to be loaded as successive frames in an image sequence at a rate between, for example, 30 Hz and 100 Hz, e.g., at 60 Hz. In conjunction with a pulse width modulation module, each pixel in the pixel module can be operated to emit light in a pattern and with intensity at least partially dependent on the image held in the image frame buffer.

Example Micro-LED Assembly and Power System

Figure 2:
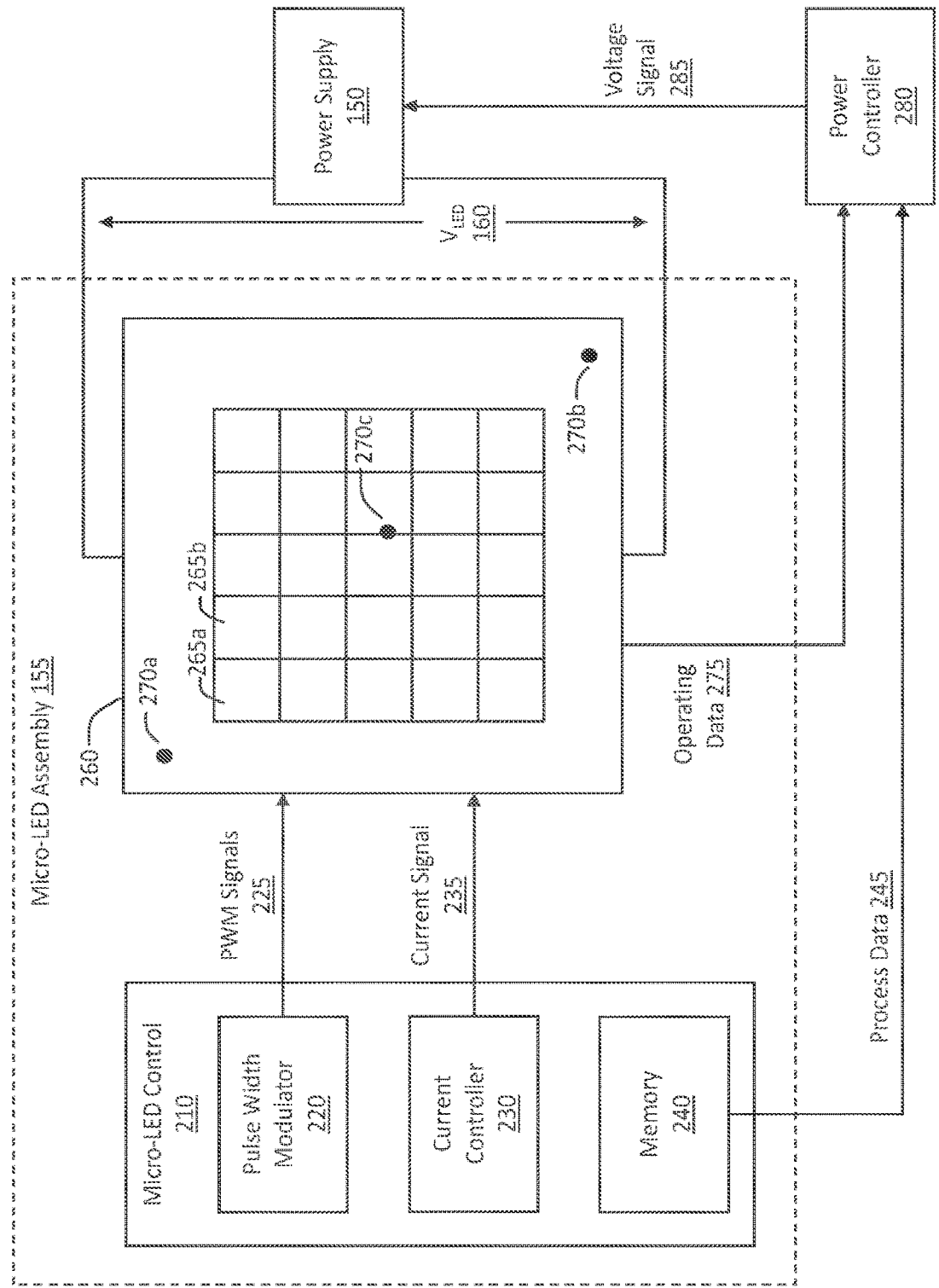
FIG. 2 illustrates an example micro-LED assembly and power system according to some embodiments of the present disclosure.

FIG. 2 illustrates an example of the micro-LED assembly 155 and power system according to some embodiments of the present disclosure. The power system includes the power supply 150 and a power controller 280, which is a control block that sets the voltage $V_{LED}$ 160 supplied by the power supply 150 to the micro-LED assembly 155 to power the micro-LEDs. The micro-LED assembly 155 and power system may be used in the vehicle headlamp application, any of the other applications described above, or other potential applications of an LED array. The micro-LED assembly 155, power supply 150, and power controller 280 may have different arrangements from the arrangement shown in FIG. 2. In some embodiments, the power controller 280 is integrated into the micro-LED assembly 155, e.g., into the micro-LED controller 210. In some embodiments, the power controller 280 is integrated into the power supply 150. In some embodiments, the power controller 280 is a component of the headlamp microprocessor 140 shown in FIG. 1. In some embodiments, the micro-LED assembly 155 has an integrated power supply, and the power supply 150 and power controller 280 are both included in the micro-LED assembly 155. In some embodiments, the memory 240 is located outside the micro-LED assembly 155, e.g., in the power controller 280.

The micro-LED assembly 155 includes a block for micro-LED control 210 and a pixel array 260. The micro-LED control 210 includes a pulse width modulator 220, a current controller 230, and a memory 240. The pixel array 260 includes pixel assemblies 265, e.g., pixel assemblies 265*a* and 265*b*, which are arranged in a matrix. Each pixel assembly 265 actively emits light and may be individually controlled by the micro-LED control 210. While 25 example pixel assemblies 265 are shown in FIG. 2, the pixel array 260 may include thousands to millions of microscopic LED pixel assemblies. To emit light in a pattern or sequence that results in display of an image, the current levels of the micro-LEDs in the pixel assemblies 265 at different locations on an array are adjusted individually according to a specific image. This can be accomplished using pulse width modulation (PWM), which turns on and off the pixels at a certain frequency. During PWM operation, the average DC current through a pixel is the product of the current amplitude and the PWM duty cycle, which is the ratio between the conduction time and the period or cycle time.

The pulse width modulator 220 generates PWM signals 225 that are output to the pixel array 260 to control the PWM duty cycles of the pixels. In some embodiments, the pulse width modulator 220 generates an individual PWM signal 225 for each pixel in the pixel array 260. In other embodiments, one PWM signal may control multiple pixels, e.g., a particular subset of pixels in the pixel array 260. In the vehicle headlamp example described with respect to FIG. 1, the pulse width modulator 220 receives the image control signals from the deserializer 135 and generates the PWM signals 225 based on the image control signals. In other embodiments, another control block within the micro-LED assembly 155 or in another system may generate the image data that is fed to the pulse width modulator 220.

The current controller 230 generates a current signal 235 provided to the pixel array 260. More particularly, the current signal 235 is provided to a current source within each pixel assembly 265 that generates a forward current for the micro-LED within each pixel assembly 265. While each pixel assembly 265 receives a unique PWM signal 225, the full pixel array 260, or blocks of multiple pixel assemblies 265 within the pixel array 260, may receive the same current signal 235, setting the same forward current across the pixel array 260 or across a given block of pixel assemblies 265. The current controller 230 receives a control signal indicating the current level from the deserializer 135 (in the vehicle headlamp example) or another digital control interface (e.g., an inter-integrated circuit (I2C) interface). The micro-LEDs in the pixel assemblies 265 emit light based on the current signal 235 and the PWM signals 225. The pixel structure and operation are described in greater detail with respect to FIG. 4.

The memory 240 stores process data 245, which is retrieved by the power controller 280. The process data 245 describes the supply voltage needed to turn on the pixel assemblies 265 under one or more operating conditions. The process data 245 may vary from one pixel array 260 to another pixel array based on manufacturing variation. In particular, the minimum supply voltage varies from array to array based on the process spread of the forward voltage of the micro-LEDs and process spread in the voltage drops across other circuit elements in the pixel assemblies 265, e.g., the voltage across the current source in each pixel assembly 265. After the pixel assemblies 265 are fabricated, a testing procedure may be performed to determine the process data 245 for the pixel array 260, and this process data 245 is stored in the memory 240. The memory 240 may be a non-volatile memory programmed during the manufacturing process.

Not only does the minimum required power supply voltage vary between different pixel arrays, but also between different operating conditions of a given pixel array. The minimum required power supply voltage is a function of multiple variables, such as the amplitude of the current source for the pixel array 260 and the temperature of the pixel array 260. In particular, variation in temperature of the micro-LEDs in the pixel assemblies 265 affects the LED forward voltage, and variation in the current amplitude affects both the LED forward voltage and the current source voltage. Example curves showing the relationship between LED forward current, LED forward voltage, and temperature are shown in FIG. 5.

The process data 245 may be obtained from a production test that determines the minimum supply voltage for a baseline set of operating conditions, e.g., an LED temperature of 25° C. and a current amplitude of 4 mA. In some embodiments, the process data 245 describes the minimum required supply voltage under various different operating conditions. For example, the process data 245 may include supply voltage levels for different combinations of temperatures and current amplitudes, e.g., a maximum and minimum current amplitude and a maximum and minimum operating temperature. In some examples, the process data 245 includes one or more formulas for calculating the supply voltage $V_{LED}$ 160 based on temperature and/or current amplitude. In other embodiments, the formulas for adjusting the supply voltage $V_{LED}$ 160 based on the operating conditions are assumed to be the same across a set of micro-LED assemblies 155, and the formulas may be stored in the power controller 280 or elsewhere. For example, the power controller 280 may be programmed decrease the supply voltage by 2 mV for each 1° C. increase in temperature relative to a baseline temperature, or increase the supply voltage +2 mV for each 1° C. decrease in temperature relative to the baseline temperature.

There may also be process spread between individual pixel assemblies 265 on a given pixel array 260, e.g., the pixel assembly 265a may have a minimum supply voltage that is 50 mV higher than another pixel assembly 265b. However, because the same supply voltage $V_{LED}$ 160 and current signal 235 are used across the pixel array 260, the highest minimum supply voltage across the pixel array 260 generally dictates the supply voltage $V_{LED}$ 160 supplied to the pixel array 260. Therefore, the memory 240 may store the highest minimum supply voltage across the pixel array 260, i.e., the supply voltage that causes all or nearly all of the pixel assemblies 265 to turn on for a baseline set of conditions and/or other sets of conditions, as described above. In other embodiments, the process data 245 includes individualized data for each individual pixel assembly 265.

Figure 3:
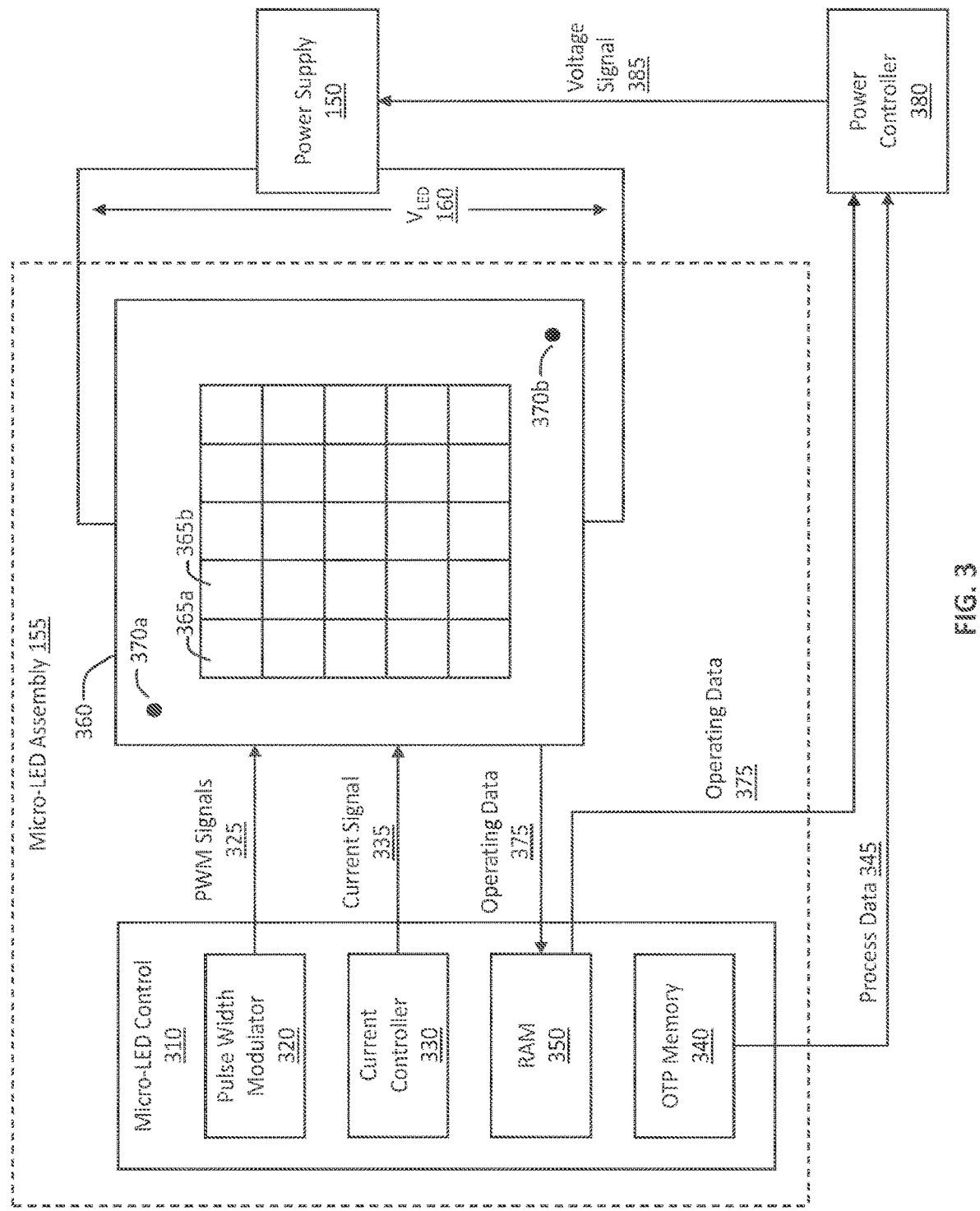
FIG. 3 illustrates an alternate arrangement of the micro-LED assembly and power system according to some embodiments of the present disclosure.

The power controller 280 receives the process data 245 from the memory 240. In the example shown in FIG. 2, the power controller 280 also receives operating data 275 from the pixel array 260. In other embodiments, some or all of the operating data 275 may be received from the micro-LED control block 310, e.g., as shown in FIG. 3. The operating data 275 includes an operating current amplitude, e.g., the current amplitude specified by the current signal 235, or a current amplitude generated by the pixel assemblies 265 and measured on the pixel array 260 (ideally, the generated current amplitude is the same as the current amplitude instructed by the current signal 235).

The operating data 275 may further include data from one or more temperature sensors 270 included in the pixel array 260. Temperature sensors 270 sense the temperature at various locations on the pixel array 260 or around the pixel array 260. As shown in FIG. 2, two example temperature sensors 270a and 270b are depicted near the edge of the matrix of pixel assemblies 265, and in particular, on opposite corners of the pixel array 260. A third example temperature sensor 270c is positioned within the matrix of pixel assemblies 265, and in particular, between two of the pixels. In other examples, additional temperature sensors 270 may be included, e.g., in the other corners of the pixel array 260, along the edges of the pixel array 260, or at one or more additional or alternate locations within the pixel array 260. The power controller 280 may process the temperature readings from multiple temperature sensors 270 to determine an average or maximum temperature across the pixel array 260, or to estimate temperature across the pixel array 260 based on the array geometry. In some embodiments, the power controller 280 may further receive image data (e.g., the PWM signals 225 or image data from the deserializer 135) and estimate the temperature across the pixel array 260 based on the image data in combination with the sensed temperature(s).

The power controller 280 determines a voltage setting for the power supply 150, i.e., the $V_{LED}$ 160 that causes the micro-LEDs in the pixel array 260 to turn on under the present conditions, based on the process data 245 and the operating data 275. For example, the power controller 280 obtain a baseline supply voltage for the pixel array 260 from the process data 245 and adjusts the supply voltage from the baseline based on the operating data 275. The power controller 280 is coupled to the power supply 150 and outputs a voltage signal 285 to the power supply 150. The voltage signal 285 instructs the power supply 150 to output $V_{LED}$ 160 at the determined voltage setting. In many or most conditions, the determined $V_{LED}$ 160 is less than a fixed $V_{LED}$ that would work across all pixel arrays under all operating conditions. By dynamically selecting a $V_{LED}$ 160 that is great enough for a given pixel array 260 and a given set of operating conditions, the power controller 280 and variable power supply 150 reduce energy usage and prevent overheating that would be caused by an excessively high fixed $V_{LED}$.

If the process data 245 includes data for individual pixels 265, the power controller 280 may determine a minimum voltage for each of the pixels, and compare the determined minimum voltage values to the image data (e.g., which pixels are turned on for a given image) to determine the voltage setting for the pixel array 260. For example, the power controller 280 selects the maximum of the minimum voltages of the pixels that are turned in a given image. If the power controller 280 further determines estimated temperatures for different locations or pixels across the array, the power controller 280 may use the estimated temperature for each pixel to determine the minimum voltage for the pixel.

FIG. 3 illustrates an alternate arrangement of the micro-LED assembly 155 and power system to some embodiments of the present disclosure. The power system includes the power supply 150 and a power controller 380, which sets the voltage $V_{LED}$ 160 supplied by the power supply 150 to the micro-LED assembly 155 to power the micro-LEDs. The power controller 380 is similar to the power controller 280 described above. The micro-LED assembly 155 includes a block for micro-LED control 310 and a pixel array 360, which is similar to the pixel array 260 described above and includes multiple pixel assemblies 365 and multiple temperature sensors 370. The micro-LED control 310 includes a pulse width modulator 320 and a current controller 330, which are similar to the pulse width modulator 220 and current controller 230 described above. The pulse width modulator 320 generates PWM signals 325, and the current controller 330 generates a current signal 335.

The micro-LED control 310 further includes a one-time programmable (OTP) memory 340 and a random-access memory (RAM) 350. The OTP memory 340 is an example of the memory 240 described above. The OTP memory 340 is programmed during or after manufacturing of the pixel array 360 to store process data 345. The process data 345 is similar to the process data 245 described above. The process data 345 is generally fixed or considered fixed for a pixel array 360 throughout its lifetime.

The micro-LED control 310 receives operating data 375 from the pixel array 360. The operating data 375 may be similar to the operating data 275 described above. In particular, the operating data 375 includes temperature measurements sensed by the temperature sensors 370 and the current amplitude for the pixel assemblies 365. The micro-LED control 310 stores the operating data 375 in the RAM 350. In some embodiments, the current signal 335 or a current amplitude indicated by the current signal 335 and provided by the current controller 330 or another component of the micro-LED control 310 is stored with the operating data 375 in the RAM 350; additional current data may or may not be received from the pixel array 360.

In this example, the power controller 380 accesses the operating data 375 from the RAM 350 of the micro-LED control 310, rather than from the pixel assembly 260 as shown in FIG. 2. The power controller 380 processes the operating data 375 and the process data 345 to determine a setting for $V_{LED}$ 160 as described above with respect to FIG. 2. In some examples, the power controller 380 receives some operating data from the micro-LED control 210 or 310, and other operating data from the pixel array 260 or 360.

Example Pixel Assemblies

FIG. 4 is a circuit diagram showing an example implementation of two pixel assemblies according to some embodiments of the present disclosure. FIG. 4 illustrates example circuit diagrams for two pixel assemblies 265a and 265b shown in FIG. 2; these may also be examples of pixel assemblies 365a and 365b shown in FIG. 3. Additional pixel assemblies in a micro-LED array may be similarly configured. Electrical connections are shown using nodes; crossings that do not have a node are not electrically connected.

Each pixel assembly 265 includes an LED 410, a PWM switch 420, and a current source transistor 430. The LED 410 may be a micro-LED or another type of LED. In this example, the LED 410 is a common anode LED. In other embodiments, the LED 410 is a common cathode LED, and the current source transistor 430 and PWM switch 420 are reconfigured accordingly. While one LED 410 is shown in each pixel assembly 265 in FIG. 4, in other embodiments, each pixel assembly 265 includes multiple LEDs 410 connected in series and/or in parallel. The LED 410 is arranged to receive the LED supply voltage $V_{LED}$ 160 that is provided by the power supply 150 and adjusted by the power controller 280. When an LED current, e.g., I1 in pixel assembly 1 265a, passes through the LED 410a, the LED 410a emits light, as indicated by the arrows in FIG. 4.

The PWM switch 420 receives a PWM signal 225 from a pulse width modulator, e.g., the PWM switch 420a in pixel assembly 1 265a receives PWM signal 1 225a, which is one of the PWM signals 225 provided by the pulse width modulator 220. In this example, each PWM switch 420 receives an individual PWM signal 225, e.g., PWM switch 1 420a receives PWM signal 1 225a, and PWM switch 2 420b receives PWM signal 2 225b. The PWM switch 420 alternately turns the LED 410 on and off according to the received PWM signal 225. In particular, the PWM switch 420 couples the current source transistor 430 to the LED 410 to turn supply the LED current (e.g., I1 or I2) to turn the LED 410 on, and decouples the current source transistor 430 from the LED 410 to turn the LED 410 off.

The current source transistor 430 generates the LED current (e.g., I1 or I2) for driving the LED 410. The current source transistor 430 is an n-type metal-oxide-semiconductor (NMOS) transistor having a gate coupled to the current signal 235, a source connected to ground, and a drain coupled to the LED 410. The amplitude of the LED current generated by the current source transistor 430 varies based on the voltage of the current signal 235. While in this example, the PWM switch 420 sits between the drain of the current source transistor 430 and the LED 410, in other embodiments, the PWM switch 420 sits between the gate of the current source transistor 430 and the current signal 235, the PWM switch 442 is opened and closed according to a PWM signal.

Example Pixel Assemblies

FIG. 5 is a graph illustrating an example relationship between LED forward current and LED forward voltage under three example temperature conditions. The LED forward current is the current generated by the current source transistor 430 based on the current signal 235. The LED forward voltage is the voltage across the LED 410 when the LED 410 is powered on. Three lines 510, 520, and 530 are plotted. In general, as the LED forward current increases, the LED forward voltage increases. This means that when the current for the pixel array 260 increases, a higher $V_{LED}$ 160 is used. For example, along the line 510, a 3 mA current has a 3.3V forward voltage across the LED 410; a 4 mA current has a 3.4V forward voltage across the LED 410; and a 6 mA current has a 3.5V forward voltage across the LED 410. Note that $V_{LED}$ 160 is generally higher than the forward voltage of the LED 410, to account for voltage across other circuit elements, e.g., the PWM switch 420 and the current source transistor 430. The voltage across the PWM switch 420 and the current source transistor 430 may also vary based on current in a similar manner, increasing as the current amplitude increases.

The line 510 may be the forward voltage curve at a baseline operating temperature, e.g., 25° C. The line 520 above the line 510 shows a forward voltage curve at a lower temperature, e.g., at a minimum operating temperature of −40° C. The line 530 below the line 510 shows a forward voltage curve at a higher temperature, e.g., at a maximum operating temperature of 85° C. As illustrated by these curves, temperature generally has a negative relationship to LED forward voltage, so that at lower operating temperatures, a higher $V_{LED}$ 160 is used, and at higher operating temperatures, a lower $V_{LED}$ 160 may be used.

The power controller 280 sets the $V_{LED}$ 160 to be high enough for a given operating condition. For example, if the operating temperature is 25° C., corresponding to line 510, and the forward current specified by the current signal 235 is set at 4 mA, the power controller 280 selects a $V_{LED}$ 160 that allows for a 3.4V forward voltage across the LEDs 410. The supply voltage $V_{LED}$ 160 may be, for example, 3.4V+0.6V=4.0V, if the voltage across the other components in each pixel assembly (e.g., the PWM switches 420 and current source transistors 430) is 0.6V for a 4 mA current. As another example, if the operating temperature is 85° C., corresponding to line 530, and the forward current specified by the current signal 235 is set at 6 mA, the power controller 280 selects a $V_{LED}$ 160 that allows for a 3.4V forward voltage across the LEDs 410. The supply voltage $V_{LED}$ 160 may be, for example, 3.4V+0.8V=4.2V, if the voltage across the other components in each pixel assembly (e.g., the PWM switches 420 and current source transistors 430) is 0.8V for a 6 mA current.

In a system without dynamic power control, $V_{LED}$ 160 is typically set at the maximum possible voltage needed across the operating conditions of the pixel array 260. In this example, if the minimum operating temperature is −40° C. (corresponding to line 520) and the maximum current is 6 mA, the $V_{LED}$ 160 is high enough to account for a 3.6V forward voltage across the LEDs 410, and the voltage across the other pixel assembly components (e.g., 0.8V), resulting in a constant 4.4V $V_{LED}$. By providing dynamic power control, the power system can significantly reduce power consumption by the micro-LED assembly 155.

Example Process for Adjusting a Power Supply

Figure 6:
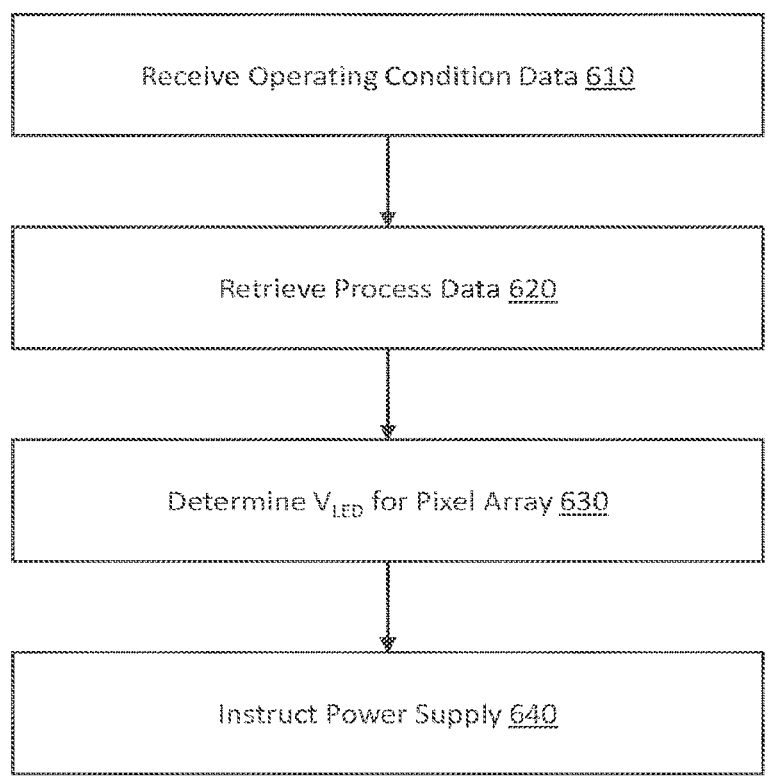
FIG. 6 illustrates a process for dynamically adjusting a power supply for an LED array, according to some embodiments of the present disclosure.

FIG. 6 illustrates a process for dynamically adjusting a power supply for an LED array, according to some embodiments of the present disclosure.

A power controller 280 receives 610 operating condition data describing operating conditions of the LED array. In particular, the power controller 280 receives temperature data from one or more temperature sensors 270 and current data describing the current amplitude driving the LED pixels assemblies 265.

The power controller 280 retrieves 620 process data for the LED array. For example, the power controller 280 retrieves data describing forward voltage through the LEDs and other elements under one or more conditions, e.g., under a set of baseline operating conditions.

The power controller 280 determines 630 a supply voltage $V_{LED}$ for the pixel array based on the operating conditions and the process data. For example, the process data provides a baseline voltage setting for the LED array obtained based on production testing, and the power controller 280 adjusts the supply voltage $V_{LED}$ from a baseline voltage setting based on the operating conditions, e.g., lowering the supply voltage if the operating temperature is higher than the test temperature, or raising the supply voltage of the current amplitude is higher than the test amplitude.

The power controller 280 instructs 640 the power supply 150 to generate the determined supply voltage $V_{LED}$. The power supply 150 provides this voltage $V_{LED}$ to the pixel array.

Other Implementation Notes, Variations, and Applications

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

It should be appreciated that the electrical circuits of the accompanying drawings and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

In some embodiments, any number of electrical circuits of the accompanying drawings may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer readable storage medium comprising instructions to allow a processor to carry out those functionalities.

In some embodiments, the electrical circuits of the accompanying drawings may be implemented as stand-alone modules (e.g., a device with associated components and circuitry configured to perform a specific application or function) or implemented as plug-in modules into application specific hardware of electronic devices. Note that some embodiments of the present disclosure may be readily included in a system on chip (SOC) package, either in part, or in whole. An SOC represents an integrated circuit (IC) that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features of any of the devices and systems described herein may also be implemented with respect to the methods or processes described herein and specifics in the examples may be used anywhere in one or more embodiments.

Select Examples

Example 1 provides a lighting system includes an LED array and a control block. The LED array includes a plurality of LED pixels, each LED pixel arranged to receive a power supply voltage from a power supply that generates a dynamically adjustable power supply voltage. The LED array further includes at least one current source to drive the plurality of LEDs. The control block is configured to be coupled to the power supply and adjusts the power supply voltage generated by the power supply based on at least one condition of the LED array.

Example 2 includes the lighting system according to example 1, where the at least one condition includes an operating condition, and the control block is configured to receive data indicating the operating condition of the LED array, and determine the power supply voltage based on the operating condition of the LED array.

Example 3 includes the lighting system according to example 2, where the operating condition is temperature, the lighting system further includes at least one temperature sensor to sense the temperature of the LED array.

Example 4 includes the lighting system according to example 3 or 4, where the operating condition is an amplitude of a current supplied by the at least one current source.

Example 5 includes the lighting system according to any of the preceding examples, further including a memory to store process data of the LED array, the at least one condition including at least a portion of the process data.

Example 6 includes the lighting system according to example 5, where the process data includes forward voltage of the LED pixels at a baseline temperature, and the control block is configured to determine a forward voltage of the LED pixels at an operating temperature based on the forward voltage of the LED pixels at the baseline temperature, and set the power supply voltage based on the determined forward voltage of the LED pixels at the operating temperature.

Example 7 includes the lighting system according to example 5 or 6, where the process data includes forward voltage of the LED pixels at a baseline current amplitude, and the control block is configured to determine a forward voltage of the LED pixels at an operating current amplitude based on the forward voltage of the LED pixels at the baseline current amplitude, and set the power supply voltage based on the determined forward voltage of the LED pixels at the operating current amplitude.

Example 8 includes the lighting system according to any of the preceding examples, where each of the plurality of LED pixels includes a PWM switch configured to receive a PWM signal and alternately switch on and off the LED based on the PWM signal.

Example 9 provides the lighting system according to any of the preceding examples, further including a control block configured to receive image data, set a current amplitude driving the plurality of LEDs based on the image data, and set a duty cycle for at least a portion of the plurality of LED pixels based on the image data, where the at least one condition for the LED array includes the current amplitude.

Example 10 provides a method for setting a power supply voltage for an LED array includes receiving operating condition data describing operating conditions of an LED array having a plurality of LED pixels; retrieving process data associated with the LED array, the process data describing forward voltage for the plurality of LED pixels under at least one operating condition; and determining a power supply voltage to power the LED array based on the operating condition data and the process data.

Example 11 provides the method according to example 10, further including transmitting an instruction to a power supply to set a power supply provided to the LED array to the determined power supply voltage.

Example 12 includes the method according to example 10 or 11, where the operating condition data includes a temperature of the LED array.

Example 13 includes method according to example 12, where the process data includes forward voltage of the LED pixels at a baseline temperature, and determining the power supply voltage includes determining a forward voltage of the LED pixels at an operating temperature based on the forward voltage of the LED pixels at the baseline temperature, and determining the power supply voltage based on the determined forward voltage of the LED pixels at the operating temperature.

Example 14 includes the method according to any of examples 10-13, where the operating condition data includes an amplitude of a current supplied to the plurality of LED pixels.

Example 15 includes the method according to example 14, where the process data includes forward voltage of the LED pixels at a baseline current amplitude, and determining the power supply voltage includes determining a forward voltage of the LED pixels at an operating current amplitude based on the forward voltage of the LED pixels at the baseline current amplitude, and determining the power supply voltage based on the determined forward voltage of the LED pixels at the operating current amplitude.

Example 16 provides an LED array that includes a plurality of LED pixels arranged in a matrix and at least one temperature sensor to sense a temperature of the LED array. Each LED pixel includes at least one LED coupled to a supply voltage, a current source to drive the at least one LED at an operating current having a current amplitude, and a PWM switch for alternately driving the at least one LED with the operating current. The at least one temperature sensor is located proximate to at least one of the plurality of LED pixels.

Example 17 includes the LED array of according to example 16, where the LED array includes a plurality of temperature sensors each positioned along an edge of the matrix of LED pixels.

Example 18 includes the LED array according to example 16 or 17, where the LED array includes at least one temperature sensor positioned within the matrix of LED pixels, the temperature sensor positioned between at least two of the LED pixels.

Example 19 includes the LED array according to any of examples 16-18, where the LED array is further configured to measure the current amplitude of the operating current and provide the measured current amplitude to a power controller, the power controller configured to adjust the supply voltage based on the measured current amplitude.

Example 20 includes the LED array according to any of examples 16-19, further including a power controller configured to receive the sensed temperature and to adjust the supply voltage based on the sensed temperature.

What is claimed is:

1. A lighting system controller comprising:
   at least one current source configured to drive a plurality of light emitting diodes (LEDs) of LED pixels in an LED array;
   a temperature sensor configured to sense a temperature of the LED array;
   control circuitry coupled to a power supply, the control circuitry configured to:
      receive operating condition data indicating the temperature of the LED array; and
      provide a signal configured to cause the power supply to adjust a power supply voltage generated by the power supply based on the temperature of the LED array; and
   a memory configured to store process data of the LED array, the operating condition data further including at least a portion of the process data.

2. The lighting system controller of claim 1, wherein the operating condition data further includes an amplitude of a current supplied by the at least one current source.

3. The lighting system controller of claim 1, wherein the process data comprises a baseline forward voltage of each of the LEDs at a baseline temperature, and the control circuitry is configured to:
   determine a forward voltage of each of the LEDs at the temperature based on the baseline forward voltage of each of the LED pixels at the baseline temperature; and
   set the power supply voltage based on the determined forward voltage of each of the LEDs at the temperature.

4. The lighting system controller of claim 1, wherein the process data comprises a baseline forward voltage of each of the LEDs at a baseline current amplitude, and the control circuitry is configured to:
   determine a forward voltage of each of the LEDs at an operating current amplitude based on the baseline forward voltage of the LEDs at the baseline current amplitude; and
   set the power supply voltage based on the determined forward voltage of each of the LEDs at the operating current amplitude.

5. The lighting system controller of claim 1, wherein each of the LED pixels comprises a pulse width modulation (PWM) switch configured to receive a PWM signal and alternately switch on and off the LED of the LED pixel based on the PWM signal.

6. The lighting system controller of claim 1, wherein the control circuitry is configured to:
   receive image data;
   set a current amplitude driving the plurality of LEDs based on the image data; and
   set a duty cycle for at least a portion of the plurality of LEDs based on the image data;
   wherein the operating condition data for the LED array further includes the current amplitude.

7. A method for setting a power supply voltage for a light emitting diode (LED) array comprising:
   receiving operating condition data describing operating conditions of the LED array, the LED array comprising a plurality of LED pixels, the operating conditions selected from a group that includes a current amplitude of a current supplied to each of the plurality of LED pixels and an operating temperature;
   retrieving process data associated with the LED array, the process data describing a baseline forward voltage for each of the plurality of LED pixels under at least one condition selected from a group of conditions that include a baseline temperature and a baseline current amplitude; and
   determining the power supply voltage to power the LED array based on the operating condition data and the process data using a forward voltage of each of the LED pixels under the operating conditions.

8. The method of claim 7, further comprising transmitting an instruction to a power supply to set a voltage provided to the LED array to the determined power supply voltage.

9. The method of claim 7, wherein the process data comprises the baseline forward voltage of the LED pixels at the baseline temperature, and determining the power supply voltage comprises:
   determining the forward voltage of each of the LED pixels at the operating temperature based on the baseline forward voltage of each of the LED pixels at the baseline temperature; and
   determining the power supply voltage based on the determined forward voltage of the LED pixels at the operating temperature.

10. The method of claim 7, wherein the process data comprises the baseline forward voltage of each of the LED pixels at the baseline current amplitude, and determining the power supply voltage comprises:
    determining the forward voltage of each of the LED pixels at the current amplitude based on the baseline forward voltage of each of the LED pixels at the baseline current amplitude; and
    determining the power supply voltage based on the determined forward voltage of each of the LED pixels at the current amplitude.

11. A light emitting diode (LED) array comprising:
    a plurality of temperature sensors each positioned along an edge of a matrix of LED pixels of the LED array, each of the LED pixels having at least one LED, at least one temperature sensor of the plurality of temperature sensors configured to sense a temperature, the at least one temperature sensor located proximate to the at least one of the LED pixels;
    a current source configured to drive the at least one LED of the LED pixels at an operating current having a current amplitude;
    a pulse width modulation (PWM) switch configured to alternately drive the at least one LED of the LED pixels with the operating current; and
    a power controller configured to receive the sensed temperature and adjust a supply voltage to the at least one of the LED pixels based on the sensed temperature.

12. The LED array of claim 11, wherein the plurality of temperature sensors further comprises at least one other temperature sensor positioned within the matrix of LED pixels, the at least one other temperature sensor is positioned between at least two of the LED pixels.

13. The LED array of claim 11, wherein the power controller is configured to adjust the supply voltage based on the current amplitude.

* * * * *